United States Patent [19]

Kooi

[11] E Re. 30,251

[45] Reissued Apr. 8, 1980

[54] SEMICONDUCTOR DEVICE COMPRISING AN INSULATED GATE FIELD EFFECT TRANSISTOR AND METHOD OF MANUFACTURING THE SAME

[75] Inventor: Else Kooi, Waalre, Netherlands

[73] Assignee: U.S. Philips Corporation, New York, N.Y.

[21] Appl. No.: 908,846

[22] Filed: May 23, 1978

Related U.S. Patent Documents

Reissue of:

[64] Patent No.: 3,676,921
Issued: Jul. 18, 1972
Appl. No.: 19,849
Filed: Mar. 16, 1970

U.S. Applications:

[62] Division of Ser. No. 727,563, May 8, 1968, Pat. No. 3,544,858.

[30] Foreign Application Priority Data

Jun. 8, 1967 [NL] Netherlands ..... 6707956

[51] Int. Cl.[2] ..... B01J 17/00
[52] U.S. Cl. ..... 29/571; 29/578
[58] Field of Search ..... 29/571, 578

[56] References Cited

U.S. PATENT DOCUMENTS

| | | | |
|---|---|---|---|
| 3,247,428 | 4/1966 | Perri | 29/578 |
| 3,442,011 | 5/1969 | Strieter | 29/578 |
| 3,445,924 | 5/1969 | Cheroff | 29/571 |
| 3,472,712 | 10/1969 | Bower | 29/571 |
| 3,475,234 | 10/1969 | Kerwin | 29/571 |
| 4,058,887 | 11/1977 | Dewitt | 29/571 |

*Primary Examiner*—W. Tupman
*Attorney, Agent, or Firm*—Thomas A. Briody; Jack Oisher; Steven R. Biren

[57] ABSTRACT

Method of making an insulated gate field effect transistor is described in which the surface of a silicon semiconductor is covered in whole or in part with a layer of a masking material which masks against oxidation, such as silicon nitride. Areas of the silicon surface are exposed for the source and drain regions, leaving the oxidation mask over the future channel. When the source and drain regions have been made, as for example by diffusion, the device is subjected to oxidation, causing the growth of a thick oxide which sinks into the silicon surface where it is not masked by the oxidation mask. Among the advantages obtained are fewer precise masking steps, a flatter device surface, and reduced gate overlap of the source and drain.

14 Claims, 7 Drawing Figures

Figure 1:
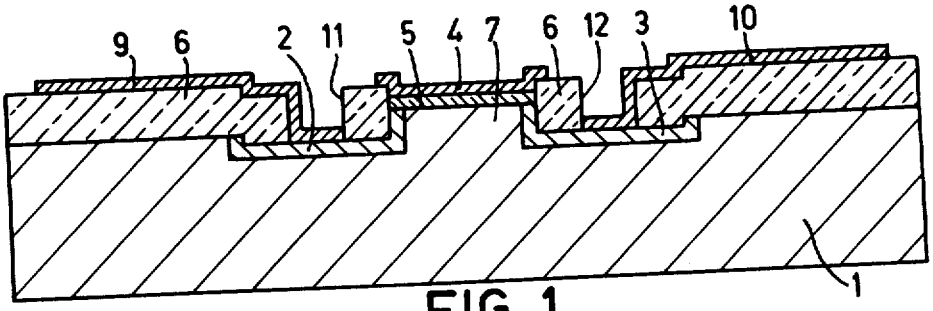

SEMICONDUCTOR DEVICE COMPRISING AN INSULATED GATE FIELD EFFECT TRANSISTOR AND METHOD OF MANUFACTURING THE SAME

Matter enclosed in heavy brackets [ ] appears in the original patent but forms no part of this reissue specification; matter printed in italics indicates the additions made by reissue.

CROSS REFERENCE

This application is a division of application Ser. No. 727,563, filed May 8, 1968, now U.S. Pat. No. 3,544,858.

The invention relates to a semiconductor device comprising a silicon semiconductor body having a part of one conductivity type in which two juxtaposed surface regions of the opposite conductivity type are provided which constitute the source and drain regions of an insulated gate field effect transistor, an insulating layer being provided on a surface of the said part and overlying the source and drain regions, said layer having a smaller thickness between the souce and drain regions than on said regions, a gate electrode being provided on the thin part of the insulating layer located between the regions. The invention furthermore relates to a method of manufacturing such a semiconductor device.

The gate electrode of an insulated gate field effect transistor constitutes, with the semiconductor body and the intermediate insulating layer, a capacitor in which the conductivity in a channel in the semiconductor body between the source and drain regions can be influenced by means of a voltage across the capacitor. In practice, the gate electrode is made to overlap the source and drain regions to some extent, so as to be sure that the channel can make a satisfactory contact with the source and drain regions and/or to be able to readily influence the conductivity in the channel throughout its length between the source and drain regions.

Where in the present description it is said that the insulating layer between the source and drain regions is thinner than on said regions, while the gate electrode is provided on the thin part located between the said regions, this should be understood to mean that the thin part of the insulating layer and the gate electrode may overlap the source and drain regions to some extent.

Because the gate electrode overlaps the source and drain regions to some extent, capacitances occur between said regions and the gate electrodes which are preferably as small as possible since they adversely influence the operation of the field effect transistor in general. It is therefore endeavoured to make the gate electrode overlap the source and drain regions as little as possible. However, in this case particularly high requirements have to be imposed upon the accuracy with which the field effect transistor is manufactured, for example, upon the photoresist method, to be used. This results in an increase of the cost-price and is time-consuming, whilst nevertheless the desired results are often not obtained.

It is known to provide the surface of the silicon body of the field effect transistor adjoining the source and drain regions with a thick insulating layer, for example, of silicon oxide, and to reduce the thickness of said oxide layer between the source and drain regions by etching. This requires a very accurate photoresist method while in addition it is difficult to obtain the desired thickness of the thin part in a reproducible manner.

It is also known to remove the thick oxide layer between the source and drain regions entirely by etching followed by the provision of a new thinner oxide layer between the source and drain regions. The thickness of the new thin oxide layer can be adjusted accurately in a simple manner but the removal of the thick oxide layer between the source and drain regions requires a very accurate photo-resist method, while the accuracy of such a photo-resist method is adversely influenced in that a thick oxide layer has to be locally removed. As is known an aperture can more accurately be provided in a thin oxide layer than in a thick oxide layer.

In the field effect transistors of the types described the gate electrode can be provided on the insulating layer with a comparatively large tolerance. If the gate electrode overlaps the thick parts of the insulating layer provided on the source and drain regions to some extent, this has little influence since the capacitances between the source and drain regions and the gate electrode caused by said overlap are small due to the large thickness of the insulating layer on the source and drain regions, while due to the presence of the thin part of the insulating layer exactly a large capacitance is possible between the gate electrode and the channel region located between the source and drain regions.

It is possible to provide those parts of a surface of a silicon body, which are to adjoin the source and drain regions to be provided, with a thick silicon oxide layer doped with an impurity and then to provide the source and drain regions by diffusion of said impurity while the remaining part of the surface is provided with a thinner silicon oxide layer by oxidation. This requires no precision photo resist method, but a drawback is that metal layers to be provided on the insulating layer have to be provided substantially entirely on the thin oxide layer.

Usually metal layers are provided on the insulating layer, which metal layers are connected to the gate electrode and, through apertures in the insulating layer, to the source and drain regions, while said metal layers may furthermore be connected to the other circuit elements provided in the silicon body and/or may be provided with connection conductors. These metal layers are preferably provided on a thick insulating layer, inter alia to restrict the capacitance between said metal layers and the semiconductor body and to restrict the possibility of short-circuit between a metal layer and the semiconductor body through a pinhole in the insulating layer.

One of the objects of the invention is to provide a field effect transistor having small capacitances between the gate electrode and the source and drain regions and a further object of the invention is to provide a method of manufacturing such a field effect transistor in which the drawbacks described are avoided at least for the greater part.

The invention is based inter alia on the recognition of the fact that by the use of an insulating layer, having thick parts of silicon oxide which are sunk in the silicon body at least for part of their thickness, the drawbacks described can be avoided while in addition the advantage is obtained that the insulating layer which consists of thin and thick parts is flatter than in known devices of the type mentioned in the preamble.

According to the invention, a semiconductor device of the type mentioned in the preamble is characterized in that at least parts of the insulating layer located on the source and drain regions consist of silicon oxide and are sunk in the silicon body for at least part of their thickness, so that between said sunken parts a silicon surface layer is present which adjoins the sunken parts throughout its thickness and which is coated with a thin part of the insulating layer on which thin part the gate electrode is present.

Due to the thick parts of the insulating layer sunk in the silicon body at least for part of their thickness, a flatter surface of the device is obtained which is of advantage inter alia in providing the gate electrode. The device according to the invention may furthermore be manufactured while avoiding a precision photo-resist method, that is to say, a photo-resist method in which a mask has to be directed with great precision relative to parts already provided, for example, the source and drain regions of the device. This will be described in detail below.

The thickness of the silicon surface layer adjoining the sunken parts throughout its thickness preferably is at least 1,000 A.

According to the invention the method of manufacturing the device according to the invention is characterized in that a diffusion mask in the form of a layer is provided on a part of one conductivity type of a silicon body, the mask comprising two juxtaposed apertures through which an impurity is diffused in the silicon body to obtain the source and drain regions of the field effect transistor, at least the part of the mask located between the apertures consisting for at least part of its thickness of a material which differs from silicon oxide and masks against oxidation, and at least the surface of the silicon body in the apertures being subjected to an oxidation treatment to obtain the parts of the silicon oxide layer sunk in the silicon body for at least part of their thickness. It will be obvious that this method requires no precision photo-resist method.

The oxidation treatment may advantageously be continued until the layer parts sunk in the silicon body for at least part of their thickness are thicker than the part of the mask originally located between the apertures and masking against oxidation. This has inter alia the following advantages. The said apertures can be very accurately provided in a thin mask. Moreover, if desired, the gate electrode may be provided on the part of the mask which masks against oxidation and is located between the apertures.

A further preferred embodiment of the method according to the invention is characterized in that the part of the mask originally located between the apertures is replaced by a silicon oxide layer which is thinner than the layer parts of silicon oxide sunk for at least part of their thickness, after which the gate electrode is provided on said thin silicon oxide layer. A thin silicon oxide layer may be desired, for example, if a great stability of the field effect transistor is necessary. It is in addition possible to use a double layer of, for example, silicon oxide and silicon nitride below the gate electrode.

A mask may preferably be used in which the part of the mask located between the apertures consists of a silicon oxide layer adjoining the silicon body and being coated with a layer of a material which masks against oxidation, the said coating of a material masking against oxidation being removed after providing the sunken layer parts of the silicon oxide, the gate electrode being then provided. Before providing the gate electrode, the silicon oxide layer originally coated with a material masking against oxidation may be subjected to the stablizing treatment and/or be given a somewhat larger thickness. An important advantage of this embodiment is that after providing the source and drain regions and the sunken layer parts, the thin silicon oxide layer on which the gate electrode may be provided is already present so that the device need not again be subjected, or be subjected at least for a much shorter period of time, to high temperatures which may occur in providing a thin oxide layer and which may influence the source and drain regions already provided.

An important embodiment of a method according to the invention is characterized in that only that part of the surface of the silicon body, on which the thin part of the insulating layer which is provided with the gate electrode has to be provided, is coated with a layer masking against oxidation, after which the non-coated part of the surface is subjected to an oxidation treatment to obtain a silicon oxide layer which is sunk in the silicon body for at least part of its thickness, the two apertures being provided in said oxide layer, said apertures adjoining the layer masking against oxidation, the impurity being diffused through said apertures to obtain the source and drain regions, silicon oxide layer parts being provided in the apertures by an oxidation treatment and being sunk in the silicon body for at least part of their thickness, and the silicon oxide layer already present growing thicker during said last oxidation treatment. In this method a thick oxide layer is obtained in a simple manner on the whole surface of the silicon body outside the channel region. By using, for etching the apertures in the oxide layer, an etching agent which etches away silicon oxide more rapidly than the material which masks against oxidation, a precision photo-resist method may be avoided in this case.

A further important embodiment of the method according to the invention is characterized in that only that part of the surface of the silicon body, on which the thin part of the insulating layer provided with the gate electrode has to be provided, and those adjacent parts of the surface which correspond to the apertures to be provided in the masking layer, are coated with a layer masking against oxidation, after which the non-coated part of the surface is subjected to an oxidation treatment to obtain a silicon oxide layer which is sunk in the silicon body for at least part of its thickness, after which apertures are provided in the layer masking against oxidation, said apertures adjoining the silicon oxide layer, the impurity being diffused through said apertures, to obtain the source and drain regions, silicon oxide layer parts being provided in said apertures by an oxidation treatment, which parts are sunk in the silicon body for part of their thickness, the silicon oxide layer already present becoming thicker during said last oxidation treatment. In this embodiment also a thick oxide layer is obtained throughout the surface of the silicon body outside the channel region, while by using an etching agent which etches away the oxidation mask more rapidly than silicon oxide, a precision photo-resist method may be avoided.

Another important embodiment of the method according to the invention is characterized in that a layer masking against oxidation is provided on the surface of the silicon body, the apertures are provided in the said layer and a deposition of the impurity to be diffused is provided in said apertures, after which the layer masking against oxidation is removed with the exception of the part of said layer located between the apertures and corresponding to the gate electrode to be provided, the part of the surface of the silicon body not coated by said part of the layer being subjected to an oxidation treatment to obtain a silicon oxide layer which is sunk in the silicon body for at least part of its thickness, the impurity diffusing further in the silicon body during the oxidation treatment. In this embodiment also a thick oxide layer is obtained throughout the surface of the silicon body outside the channel region while avoiding a precision photo-resist method.

Silicon nitride is preferably used as the material which is resistant against oxidation since very good results have been obtained with this substance.

Figure 2:
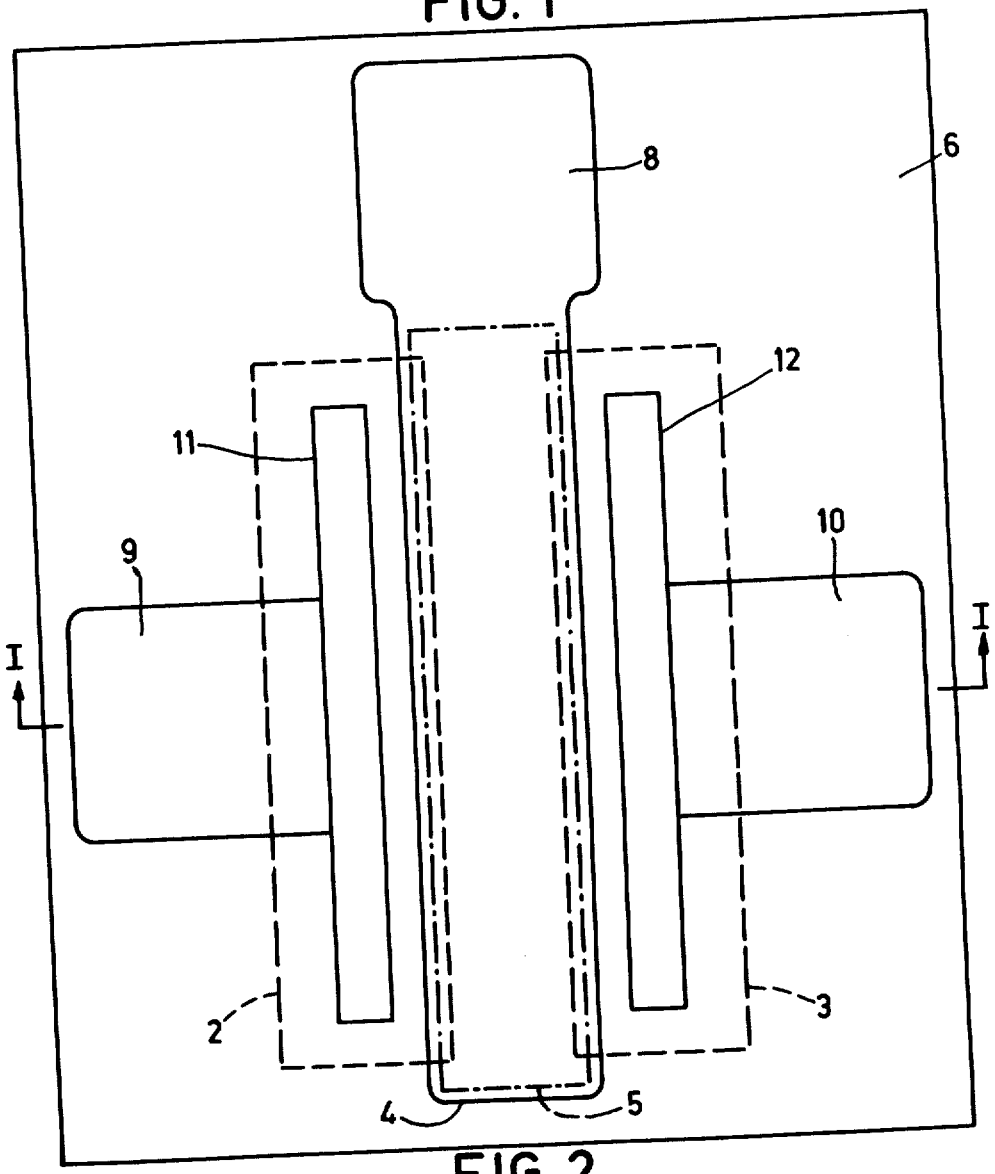
Figure 3:
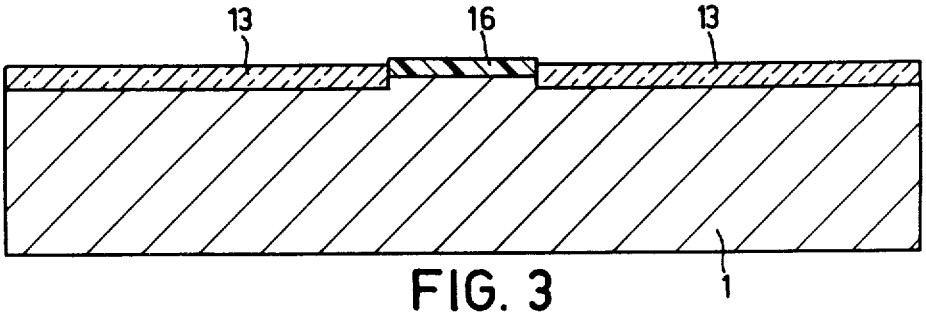

In order that the invention may be readily carried into effect, embodiments thereof will now be described in greater detail, by way of example, with reference to the accompanying diagrammatic drawings, in which FIG. 1 is a cross-sectional view of a field effect transistor according to the invention taken on the line I—I of FIG. 2, FIG. 2 is a plan view of said field effect transistor, FIGS. 3 to 7 are cross-sectional views of various stages of said field effect transistor which occur during the manufacture of the field effect transistor.

FIGS. 1 and 2 show an example of a semiconductor device according to the invention having a silicon body 1 of one conductivity type in which two juxtaposed surface regions 2 and 3 of the opposite conductivity type are provided which constitute the source and drain region of the field effect transistor of the type having an insulated gate electrode 4. An insulating layer 5, 6 is provided on the surface of the silicon body 1 and across the source and drain regions 2 and 3, which layer has a smaller thickness between the source and drain regions 2 and 3 (part 5) than on said regions. The gate electrode 4 is provided on the thin part 5 of the insulating layer 5, 6 located between the regions 2 and 3.

According to the invention, at least the parts 6 of the insulating layer 5, 6 located on the source and drain regions 2, 3, consist of silicon oxide and are sunk in the silicon body 1 through at least part of their thickness, so that between said sunken parts 6 a silicon surface layer or mesa 7 is present which adjoins the sunken parts 6 throughout its thickness and which is coated with the thin part 5 of the insulating layer 5, 6, on which thin part 5 the gate electrode 4 is present.

In the present embodiment the parts 6 of the insulating layer 5, 6 sunk in the silicon body 1 for part of their thickness extend substantially over the whole surface outside the channel region, that is to say, the region between the source and drain regions 2 and 3 of the silicon body 1.

The silicon surface layer 7 has a thickness of at least 1,000 A.

The gate electrode 4 comprises a part 8 located on the part 6 of the insulating layer 5, 6 to which part 8 a connection conductor such as a wire may be connected. Connection conductors may also be connected to the metal layers 9 and 10 on the part 6 which are connected to the source and drain regions 2 and 3 through the apertures 11 and 12 in the part 6.

The silicon body 1 may form part of a larger silicon body in which a number of circuit elements may be provided. In that case the silicon body 1 is a part of one conductivity type of the larger silicon body. The metal layers 8, 9 and 10 may be constructed in a conventional manner so that they constitute a connection to the other circuit elements.

Since the thick part 6 of the insulating layer 5, 6 is sunk in the silicon body 1 for part of its thickness, the surface of the said layer is flatter than in the known field effect transistors having an insulating layer with a thick part and a thin part. This is of advantage in providing the gate electrode.

The most important advantage of a field effect transistor according to the invention, however, is that it may be manufactured without a precision photo-resist method.

An example of a method according to the invention of manufacturing the field effect transistor shown in FIGS. 1 and 2 will now be described.

According to the invention such a method is characterized in that a diffusion mask 13, 16 in the form of a layer (see FIG. 4) is provided on the silicon body 1 and comprises two juxtaposed apertures 14 and 15 through which an impurity is diffused in the silicon body 1 to obtain the source and drain regions 2 and 3, at least the part 16 of the mask located between the apertures 14 and 15 consisting, at least for part of its thickness, of a material differing from silicon oxide and masking against oxidation, and at least the surface of the silicon body in the apertures 14 and 15 being subjected to an oxidation treatment to obtain the layer parts 6 of silicon oxide sunk in the silicon body for part of their thickness.

In the present example an embodiment of the method according to the invention will be used in which only the part of the surface of the silicon body 1, on which the thin part 5 of the insulating layer 5, 6 provided with the gate electrode 4 has to be provided, is coated with a layer 16 (FIG. 3) masking against oxidation, after which the non-coated part of the surface is subjected to an oxidation treatment to obtain a silicon oxide layer 13 which is sunk in the silicon body 1 for part of its thickness. The two apertures 14 and 15 (FIG. 4) are provided in the oxide layer 13, said apertures adjoining the layer 16 masking against oxidation. Herewith the diffusion mask 13, 16 is obtained. An impurity to obtain the source and drain regions 2 and 3 is diffused through the apertures 14 and 15 (FIG. 5), while by an oxidation treatment silicon oxide layer parts are provided in the apertures 14 and 15 which parts are sunk in the silicon body 1 for part of their thickness, while the silicon oxide layer 13 already present grows thicker, so that the thick silicon oxide layer 6 is obtained.

A p-type silicon body 1 (FIG. 3) having a resistivity of, for example, 10 Ohm cm and a thickness of approximately 200 microns is used as the starting material. The further dimensions of the silicon body are of no significance and should only be sufficiently large to be able to provide the field effect transistor.

Usually a plurality of field effect transistors will simultaneously be provided in a silicon body after which the silicon body is subdivided.

A layer of silicon nitride, approximately 0.2 micron thickness, is provided on the silicon body. This layer may be provided in a conventional manner by leading over a gas mixture of silane and ammonia. Silicon nitride masks against oxidation.

The silicon nitride layer is removed by means of a conventional photo-resist method with the exception of the part 16 the dimensions of which are approximately $15 \times 1{,}000$ microns.

The silicon oxide layer 13, thickness approximately 0.3 micron, is then provided by oxidation. For that purpose, for example, steam is led over the silicon body which is kept at a temperature of approximately 1,000° C. until the desired thickness is obtained.

The apertures 14 and 15, dimension approximately 950×25 microns, which adjoin the silicon nitride layer 16 are then provided in the silicon oxide layer 13 by means of a conventional photo-resist method and an etching agent. The apertures 14 and 15 (FIG. 4) to be provided must adjoin the silicon nitride layer 16, but by using an etching agent which attacks silicon oxide more rapidly than silicon nitride no precision photo-resist method is required. Actually, apertures may be provided in the etching mask which overlap the silicon nitride layer 16 or even one aperture corresponding to the silicon nitride layer 16 and two adjacent parts of the silicon oxide layer 13. In the cross-sectional view shown in FIG. 4 some difference in width of the apertures 14 and 15 to be provided is of no importance.

The etching agent may consist, for example, of a saturated solution of ammonium fluoride in water to which 2 percent by weight of hydrofluoric acid has been added. This etching agent attacks the silicon oxide much more rapidly than silicon nitride.

Phosphorus is diffused in the silicon body 1 through the apertures 14 and 15. For that purpose the silicon body together with a quantity of phosphorus-doped silicon powder is heated in an evacuated quartz tube at approximately 1,000° C. for approximately 10 minutes, after which the silicon body is removed from the quartz tube.

The silicon body is then heated at a temperature of approximately 1,000° C., steam being led over the body 1, until a silicon oxide layer, thickness approximately 0.8 microns, is obtained in the apertures 14 and 15. The silicon oxide layer 13 grows thicker and reaches a thickness of approximately 0.85 micron. The thick silicon oxide layer 6 is then obtained and extends substantially throughout the surface of the silicon body outside the channel region which is located in the surface layer 7, which layer 6 is sunk in the silicon body 1 for approximately 0.35 micron.

The silicon surface layer 7 which adjoins, throughout its thickness, the oxide layer 6 which is sunk for part of its thickness, thus has a thickness of approximately 0.35 micron.

The phosphorus further diffuses during the oxidation process and after obtaining the layer 6 the n-type source and drain regions 2 and 3 have a thickness of well over 1 micron.

The thickness of the silicon oxide layer 6 sunk for part of its thickness in the silicon body 1 is much larger than that of the part 16 of the mask 13, 16 originally located between the apertures 14 and 15 and masking against oxidation.

The gate electrode may be provided on the part 16 of the mask 13, 16 originally located between the apertures 14 and 15 and masking against oxidation. With a view to satisfactory electrical properties of the field effect transistors to be manufactured, however, it may be desirable to replace the part 16 of the mask 13, 16 originally located between the apertures 14 and 15 by a silicon oxide layer 5 (FIGS. 1 and 2) which is considerably thinner than the oxide layer 6 sunk for part of its thickness, after which the gate electrode 4 is provided on said thin oxide layer 5.

The silicon nitride layer 16 is removed by dipping the silicon body in phosphoric acid with the temperature of approximately 190° C. until the layer 16 is removed. The oxide layer 6 will become thinner and has a thickness of approximately 0.7 microns.

In order to obtain the silicon oxide layer 5, the silicon body 1 is then heated at a temperature of 1,000° C. for 10 minutes, steam being led over the body 1. In order to improve the quality of the oxide layer 5, the silicon body 1 is heated in oxygen at a temperature of approximately 1,000° C. for approximately 10 minutes, in nitrogen at a temperature of approximately 1,000° C. for approximately 5 minutes, and in water-vapour-containing nitrogen at a temperature of approximately 450° C. for approximately 30 minutes. The layer 5 has a thickness of approximately 0.2 micron.

It is to be noted that the silicon oxide layer 5 may alternatively be obtained by converting the silicon nitride layer 16 into silicon oxide by anodic oxidation.

Then apertures 11 and 12, dimension approximately 850×10 micron, are provided in the oxide layer by means of a conventional photo-resist method and an etching agent.

The gate electrode 4 with the part 8 and the metal layers 9 and 10 which are connected to the region 2 and 3 through the apertures 11 and 12 are then provided in the conventional manner. The parts 4, 8, 9 and 10 may consist of aluminum.

Herewith the field effect transistor according to the invention has been obtained. Connection conductors may be connected to the metal layers 8, 9 and 10 and the field effect transistor may be arranged in an envelope in any conventional manner.

Instead of the mask 13, 16 (FIGS. 3, 4), with the layer 16 of silicon nitride, a mask may alternatively be used in which the part 16 of the mask 13, 16 located between the apertures 14 and 15 consists of a silicon oxide layer which is coated with a layer of a material which masks against oxidation, said coating of a material masking against oxidation being removed after providing the silicon oxide layer 6 sunk for part of its thickness, the gate electrode being then provided on the remaining oxide layer which immediately forms the oxide layer shown in FIGS. 1 and 2. The layer 16 may consist, for example, of a silicon oxide layer, thickness 0.2 microns, which is provided on the silicon body 1, and is coated with a layer of silicon nitride which may likewise have a thickness of approximately 0.2 micron. The quality of the oxide layer 5 remaining after removing the silicon nitride layer may be improved in the manner already described above, before providing the gate electrode 4. In this manner the regions 2 and 3 are exposed for a shorter period of time to the high temperatures which are required for providing the layer 5.

Figure 6:
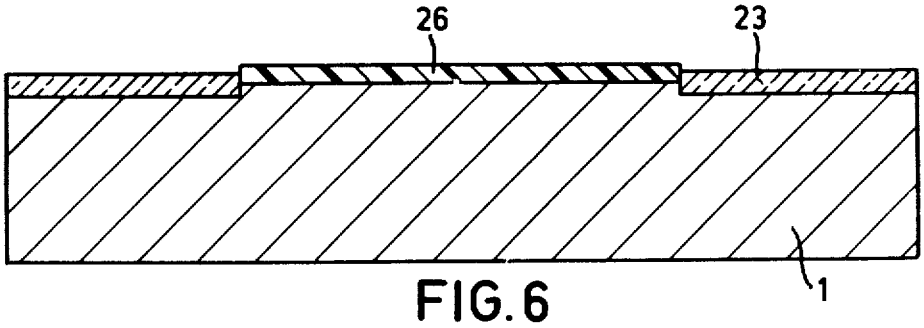
Figure 7:
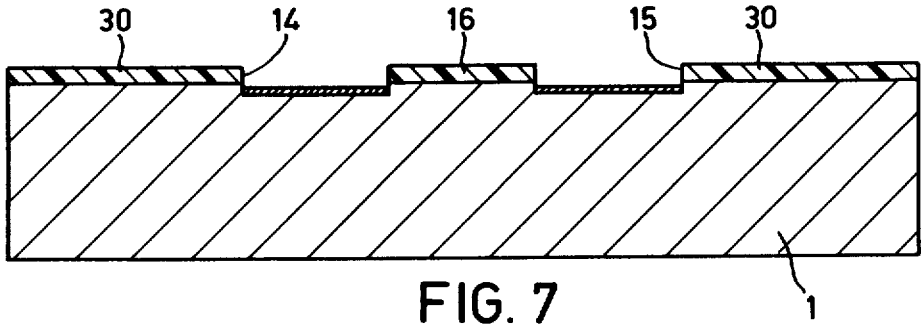

In a further important embodiment of a method according to the invention, the part of the surface of the starting silicon body 1 on which the thin part 5 of the insulating layer 5, 6, provided with the gate electrode 4, has to be provided and those adjacent parts of the surface which correspond to the apertures 14 and 15 to be provided in the masking layer, are coated with a layer 26 masking against oxidation and consisting, for example, of silicon nitride, see FIG. 6, after which, by oxidation, like in the preceding example, a silicon oxide layer 23 which is sunk in the silicon body 1 for part of its thickness is provided.

The apertures 14 and 15 are then provided in the silicon nitride layer 26, the apertures adjoining the oxide layer 23.

By using an etching agent which does not attack silicon oxide, or attacks silicon oxide at least far less rapidly than silicon nitride, a precision photo-resist method may be avoided in a similar manner as in the preceding example. Phosphoric acid, for example, may be used as an etching agent.

Figure 4:
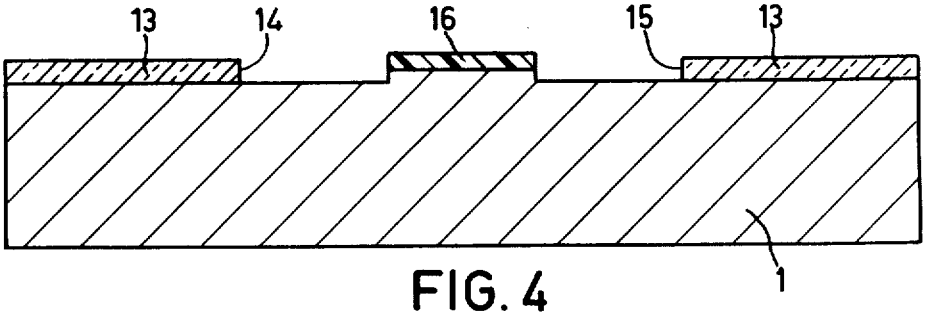

After providing the apertures 14 and 15, the diffusion mask 13, 16 as shown in FIG. 4 is obtained, and, in the same manner as described in the preceding example, an impurity may be diffused through the apertures 14 and 15 to obtain the source and drain regions 2 and 3, while by an oxidation treatment silicon oxide layer parts are provided in said apertures and are sunk in the silicon body at least for part of their thickness, the silicon oxide layer already present growing thicker so that the oxide layer 6 is obtained which in this case also extends substantially throughout the surface of the silicon body 1 outside the channel region between the regions 2 and 3.

In another important embodiment of a method according to the invention, a layer, for example, a silicon nitride layer 16, 30 (see FIG. 7) masking against oxidation is provided on a surface of the starting silicon body 1, in which layer the apertures 14 and 15 are provided in any conventional manner. A deposition of the impurity to be diffused which consists, for example of phosphorus, is provided in the apertures, phosphorus being diffused in very thin surface layers adjoining the apertures 14 and 15. So the layer 16, 30 serves as a diffusion mask. The part 30 of the layer 16, 30 masking against oxidation is then removed, the part 16 of the layer 16, 30 located between the apertures 14 and 15 and corresponding to the gate electrode 4 to be provided being maintained.

Figure 5:
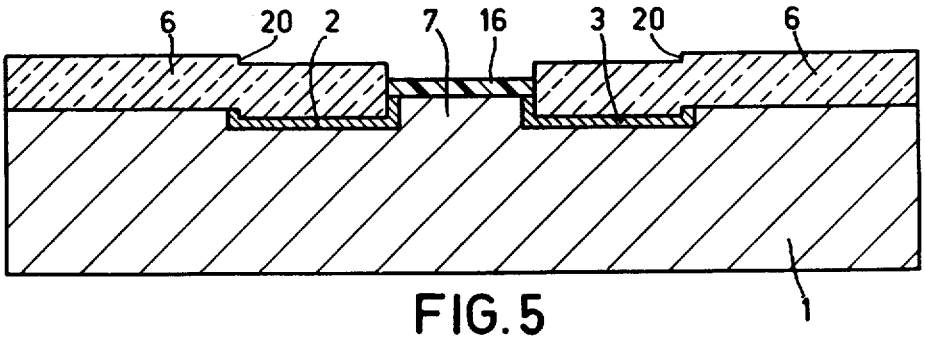

The surface of the silicon body 1 not coated by the part 16 is then subjected to an oxidation treatment to obtain a thick silicon oxide layer sunk in the silicon body for part of its thickness. This oxidation treatment may be carried out in a manner similar to that described in the preceding examples to obtain the oxide layer 6. During this oxidation treatment the phosphorus diffuses deeper in the silicon body 1 so that a structure as shown in FIG. 5 is obtained with only the difference that the unevenesses 20 in the layer 6 at the edges of the regions 2 and 3 do not occur.

So in this case also a thick oxide layer is obtained throughout the surface of the silicon body 1 outside the channel region between the regions 2 and 3.

It will be obvious that the invention is not restricted to the embodiments described and that many variations are possible for those skilled in the art without departing from the scope of this invention. For example, in the last embodiment described with reference to FIG. 7, it is possible not to remove the part 30 of the silicon nitride layer 16, 30 and to provide only a silicon oxide layer in the apertures 14 and 15 sunk in the silicon body 1 for part of its thickness. Furthermore, a material masking against oxidation other than silicon nitride may be used. A field effect transistor according to the invention may have a different configuration, for example, a concentric configuration, differing from that shown in FIGS. 1 and 2.

What is claimed is:

[1. A method of manufacturing an insulated gate field effect transistor comprising providing a silicon semiconductive body portion of one-type conductivity, providing on a surface of said body portion an impurity masking layer having at least two adjacent apertures with at least the portion of said masking layer between said apertures and at least over part of its thickness being of masking material other than silicon oxide and also capable of masking the silicon against oxidation, providing by impurity introduction through said apertures spaced surface regions of the opposite type conductivity in said body portion, subjecting at least surface portions of the body portion overlying the opposite type surface regions and adjacent the oxidation masking material to an oxidation treatment causing thereon the growth of a silicon oxide that penetrates into the body portion except where masked by oxidation masking material forming a silicon mesa under said oxidation masking material applying a gate electrode insulated from and over the surface portion extending between the opposite type surface regions, and applying source and drain connections to the opposite type surface regions.]

[2. A method of manufacturing an insulated gate field effect transistor comprising providing a silicon semiconductive body portion of one-type conductivity, providing on a surface of said body portion an impurity masking layer having at least two adjacent apertures with at least the portion of said masking layer between said apertures and at least over part of its thickness being of masking material other than silicon oxide and also capable of masking the silicon against oxidation, providing by impurity introduction through said apertures spaced surface regions of the opposite type conductivity in said body portion, thereafter subjecting at least surface portions of the body portion overlying the opposite type surface regions and adjacent the oxidation masking material to a oxidation treatment causing thereon the growth of a silicon oxide that penetrates into the body portion except where masked by oxidation masking material forming a silicon mesa under said oxidation masking material, applying a gate electrode insulated by an insulating layer which is substantially thinner than the said penetrated grown oxide from and over the surface portion extending between the opposite type surface regions, and applying source and drain connections to the opposite type surface regions.]

[3. A method as set forth in claim 2 wherein the oxidation treatment is continued until the thickness of the grown silicon oxide is substantially greater than that of the portion of the masking layer between the opposite type surface regions.]

[4. A method as set forth in claim 2 wherein the gate electrode is provided on the oxidation masking material.]

[5. A method as set forth in claim 2 wherein silicon nitride is the oxidation masking material.]

[6. A method as set forth in claim 2 wherein, after the oxidation treatment, the portion of the masking layer between the opposite type surface regions is removed and replaced by an insulating layer which is thinner than the penetrated grown oxide, and the gate electrode is provided on the insulating layer.]

[7. A method as set forth in claim 2 wherein the body portion is provided with a masking layer which between the apertures consist essentially of a silicon oxide layer on the silicon body portion with said oxidation masking material on the silicon oxide, and following the oxidation treatment the oxidation masking material is removed and the gate electrode provided in its place on the silicon oxide layer.]

8. A method of manufacturing an insulated gate field-effect transistor comprising providing a silicon semiconductive body portion of one-type conductivity, providing only on a surface portion of said body portion to constitute the transistor channel a layer of diffusion masking material which at least over part of its thickness is of a material other than silicon oxide and also capable of masking the underlying silicon against oxidation, subjecting the non-masked surface portions of the body portion to a first oxidation treatment causing the growth of a silicon oxide that penetrates into the body portion except where masked by the oxidation masking material, providing adjacent opposite sides of the masking layer spaced apertures in said oxide layer, diffusing impurities into the body portion through said apertures to form opposite type source and drain regions and subjecting the body to a second oxidation treatment to cause the growth of an oxide in the apertures that penetrates into the body portion, applying a gate electrode insulated from and over the surface portion to constitute the transistor channel, and applying source and drain connections to the opposite type surface regions.

9. A method of manufacturing an insulated gate field-effect transistor comprising providing a silicon semiconductive body portion of one-type conductivity, providing only on a surface portion of said body portion to constitute the transistor channel and the source and drain regions a lyer of diffusion masking material which at least over part of its thickness is of a material other than silicon oxide and also capable of masking the underlying silicon against oxidation, subjecting the non-masked surface portions of the body portion to a first oxidation treatment causing the growth of a silicon oxide that penetrates into the body except where masked by the oxidation masking material, removing spaced parts of said masking layer over the source and drain regions to be made, diffusing impurities into the body portions exposed by the removed masking layer parts to form opposite type source and drain regions and subjecting exposed body portions adjacent the surface portion to constitute the transistor channel to a second oxidation treatment to cause the growth of an oxide thereat that penetrates into the body portions, applying a gate electrode insulated from and over the surface portion to constitute the transistor channel, and applying source and drain connections to the opposite type surface regions.

10. A method as set forth in claim 9 wherein the second oxidation treatment is continued until the thickness of the grown silicon oxide is substantially greater than that of the portion of the masking layer between the opposite type surface regions.

11. A method as set forth in claim 9 wherein the gate electrode is provided on the oxidation masking material.

12. A method as set forth in claim 9 wherein silicon nitride is the oxidation masking material.

13. A method as set forth in claim 9 wherein, after the second oxidation treatment, the portion of the masking layer between the opposite type surface region is removed and replaced by an insulating layer which is thinner than the grown oxide, and the gate electrode is provided on the insulating layer.

14. A method as set forth in claim 9 wherein the body portion is provided with a masking layer which between the apertures consists essentially of a silicon oxide layer on the silicon body portion with said oxidation masking material on the oxide layer, and following the second oxidation treatment the masking material is removed and the gate electrode provided in its place on the silicon oxide layer.

15. A method as set forth in claim 9 wherein the various oxide layers with various thicknesses are grown to penetrate over various distances into the body portion so as to provide a substantially flat surface on top, the gate electrode and source and drain connections having portions extending over the said substantially flat surface.

[16. A method of manufacturing an insulating gate field-effect transistor comprising providing a silicon semiconductive body portion of one-type conductivity, providing on a surface of the body portion a layer of diffusion masking material which at least over part of its thickness is of a material other than silicon oxide and also capable of masking the underlying silicon against oxidation, providing spaced apertures in said masking layer, diffusing impurities into the body portion through said apertures to form opposite type source and drain regions, removing the masking layer except for a portion overlying the body surface between the source and drain regions, subjecting the body portion to an oxidation treatment to cause the growth of an oxide on the non-masked surface that penetrates into the body portion, applying a gate electrode insulated from and over the surface portion extending between the opposite type surface regions, and applying source and drain connections to the opposite type surface regions.]

17. A method of manufacturing an insulated gate field-effect transistor comprising providing a silicon semiconductive body portion of one-type conductivity, providing only on a surface portion of said body portion to constitute the transistor channel and the source and drain regions a layer of masking material which over at least part of its thickness is of a material other than silicon oxide and capable of masking the underlying silicon against oxidation, subjecting the nonmasked surface portions of the body portion to an oxidation treatment causing the growth of a silicon oxide that penetrates into the body portion except where masked by the masking material, providing spaced opposite type source and drain regions in the semiconductive part not covered by said silicon oxide, applying a gate electrode insulated from and over the surface portion extending between the opposite type source and drain regions, and applying source and drain connections to the opposite type source and drain regions.

18. A method as set forth in claim 17 wherein the masking layer over at least part of its thickness comprises silicon nitride.

[19. A method of manufacturing an insulated gate field effect transistor comprising providing a silicon semiconductive body portion of one-type conductivity, providing on a surface of said body portion a diffusion masking layer having at least two adjacent apertures with at least the portion of said masking layer between said apertures and at least over part of its thickness being of silicon nitride and also capable of masking the underlying silicon against oxidation, providing by diffusion through said apertures spaced surface regions of the opposite type conductivity in said body portion, thereafter subjecting at least the surface portion of the body portion overlying the opposite type surface regions to an oxidation treatment causing thereon the growth of a silicon oxide that penetrates into the body portion except where masked by said oxidation masking material forming a silicon mesa under said oxidation masking material, applying a gate electrode insulated from and over the surface portion extending between the opposite type surface regions, and applying source and drain connections through holes in the said penetrated grown oxide to the opposite type surface regions.]

[20. A method as set forth in claim 19 wherein the oxidation treatment is continued until the thickness of the grown silicon oxide is substantially greater than that of the portion of the masking layer between the opposite type surface regions.]

*21. A method as set forth in claim 18 wherein the silicon nitride is removed before the gate electrode is applied.*

*22. A method as set forth in claim 21 wherein the masking layer comprises an intermediate silicon oxide layer on the silicon body portion and a silicon nitride layer on the oxide layer and wherein before applying the gate electrode the silicon nitride layer is removed whereafter the gate electrode is applied over part of the intermediate oxide layer.*

*23. A method of manufacturing an insulated gate field effect transistor comprising providing a silicon semiconductive body portion of one-type conductivity, providing on a surface of said body portion an impurity masking layer having at least two adjacent apertures with at least the portion of said masking layer between said apertures and at least over part of its thickness being of masking material other than silicon oxide and also capable of masking the silicon against oxidation, providing by impurity introduction through said apertures spaced surface regions of the opposite type conductivity in said body portion, thereafter subjecting at least surface portions of the body portion overlying the opposite type surface regions and adjacent the oxidation masking material to an oxidation treatment causing thereon the growth of a silicon oxide that penetrates into the body portion except where masked by oxidation masking material forming a silicon mesa under said oxidation masking material, after the oxidation treatment removing the portion of the masking layer between the opposite type surface regions and replacing said portion of the masking layer by an insulating layer which is thinner than the penetrated grown oxide, providing a gate electrode on the thinner insulating layer, and applying source and drain connections to the opposite type surface regions.*

*24. A method of manufacturing an insulated gate field effect transistor comprising providing a silicon semiconductive body portion of one-type conductivity, providing on a surface of said body portion an impurity masking layer having at least two adjacent apertures with at least the portion of said masking layer between said apertures consisting essentially of a silicon oxide layer on the silicon body and on the silicon oxide a layer of masking material other than silicon oxide and also capable of masking the silicon against oxidation, providing by impurity introduction through said apertures spaced surface regions of the opposite type conductivity in said body portion, thereafter subjecting at least surface portions of the body portion overlying the opposite type surface regions and adjacent the oxidation masking material to an oxidation treatment causing thereon the growth of a silicon oxide that penetrates into the body portion except where masked by oxidation masking material forming a silicon mesa under said oxidation masking material, following the oxidation treatment removing the oxidation masking material and providing a gate electrode in its place on the silicon oxide layer, said silicon oxide layer under the gate electrode being substantially thinner than the said penetrated grown oxide, and applying source and drain connections to the opposite type surface regions.*

* * * * *